(12) United States Patent
McClure et al.

(10) Patent No.: US 6,750,683 B2
(45) Date of Patent: Jun. 15, 2004

(54) POWER SUPPLY DETECTION CIRCUITRY AND METHOD

(75) Inventors: David C. McClure, Carrollton, TX (US); Rong Yin, Coppell, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/846,524

(22) Filed: Apr. 30, 2001

(65) Prior Publication Data

US 2002/0158673 A1 Oct. 31, 2002

(51) Int. Cl.$^7$ ................................................. H03K 5/22
(52) U.S. Cl. ......................... 327/78; 327/539; 327/538
(58) Field of Search ............................ 327/77, 78, 72, 327/73, 530, 538, 539–541, 543; 232/313, 316

(56) References Cited

U.S. PATENT DOCUMENTS

| | | | |
|---|---|---|---|
| 5,627,493 A | * | 5/1997 | Takeuchi et al. ............ 327/546 |
| 5,856,756 A | * | 1/1999 | Sasahara et al. ............ 327/540 |
| 5,886,565 A | * | 3/1999 | Yasui et al. ................. 327/530 |
| 6,091,287 A | * | 7/2000 | Salter et al. ................. 327/543 |
| 6,118,188 A | * | 9/2000 | Youssef ....................... 307/43 |
| 6,166,530 A | * | 12/2000 | D'Angelo .................... 323/316 |
| 6,281,734 B1 | * | 8/2001 | McClure et al. ............ 327/308 |
| 6,476,669 B2 | * | 11/2002 | McClure et al. ............ 327/543 |

* cited by examiner

Primary Examiner—Terry D. Cunningham
Assistant Examiner—Long Nguyen
(74) Attorney, Agent, or Firm—Lisa K. Jorgenson; Andre Szuwalski

(57) ABSTRACT

A circuit and method are disclosed for monitoring the voltage level of an unregulated power supply. The circuit includes a voltage reference circuit for generating a first reference voltage signal and a trim circuit which generates a trimmed reference voltage signal based upon the first reference voltage signal. A comparator compares the unregulated power supply voltage to the trimmed reference voltage signal and asserts an output signal based upon the comparison. The output signal is fed back as an input to the trim circuit so that the trim circuit provides a hysteresis effect.

33 Claims, 5 Drawing Sheets

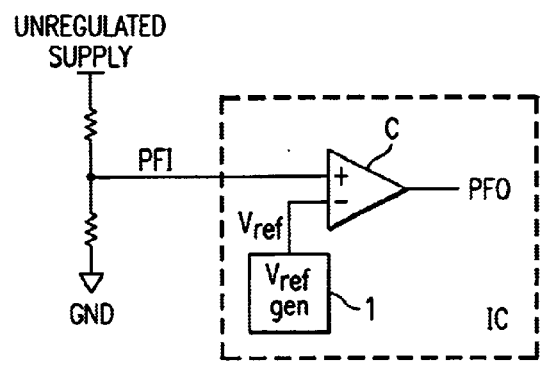
FIG. 1
*(PRIOR ART)*
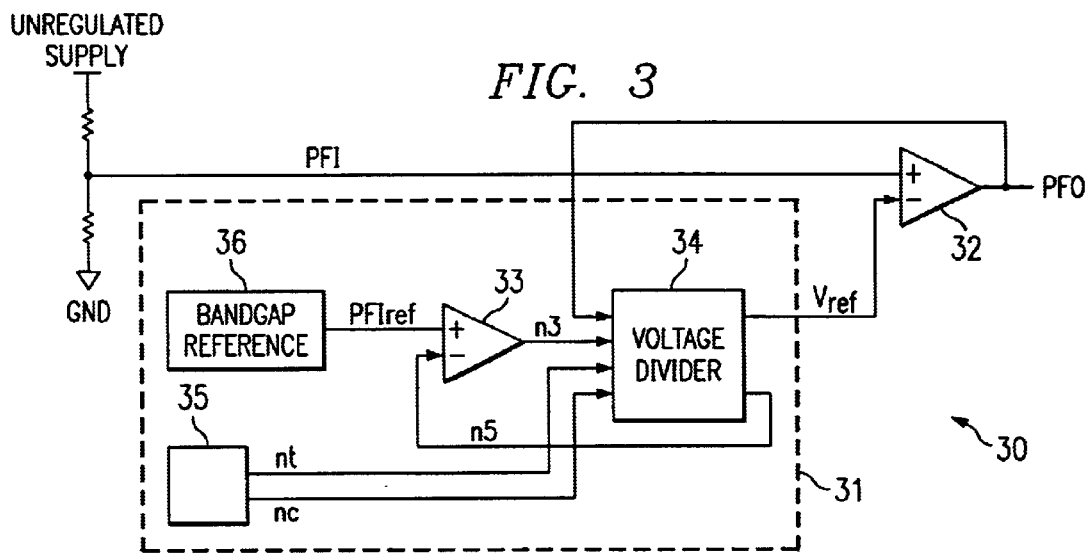
FIG. 3
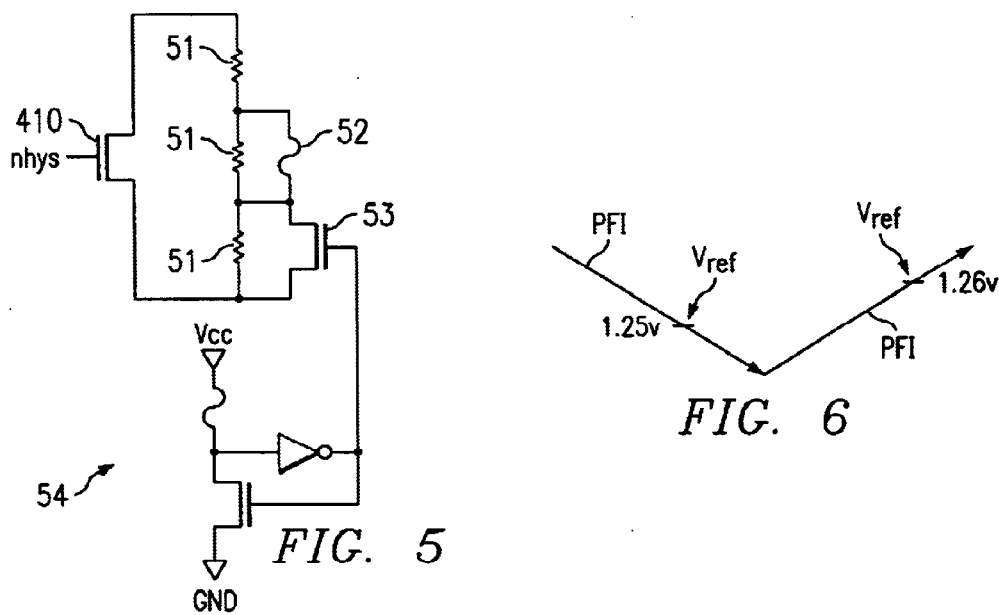
FIG. 5
FIG. 6

POWER SUPPLY DETECTION CIRCUITRY AND METHOD

BACKGROUND OF THE INVENTION

1. Technical Field of the Invention

The present invention relates to monitoring power supplies, and particularly to a circuit and method for detecting voltage supply levels provided to an integrated circuit chip.

2. Description of the Related Art

Advancements in the semiconductor industry have led to increased demands for circuit performance. In an effort to more tightly control operating conditions so as to meet the increased demands placed on integrated circuitry, some existing integrated circuitry monitor power supply levels, such as the voltage supply level from an unregulated power supply, so as to detect instances in which the power supply level falls below a predetermined level, such as a predetermined minimum voltage level.

One existing power supply monitor circuit is shown in FIG. 1. An unregulated voltage is generated from a voltage divider of an unregulated power supply. A comparator C compares the unregulated voltage to a predetermined voltage reference Vref. The comparator C asserts a power fail signal PFO in the event the unregulated voltage falls below the predetermined voltage reference Vref. The power fail signal PFO may be, for example, provided to a processor or other controller device. Upon the power fail signal PFO being asserted, the processor/controller device may take appropriate remedial action, such as switching to a battery backup supply.

An existing voltage reference circuit 1 for generating the predetermined voltage reference Vref is shown in FIG. 2. The existing voltage reference may be seen as a unity gain differential amplifier 2 that forms a voltage follower circuit with voltage divider circuit 3. The voltage follower circuit is a trim circuit that provides a trimmed offset voltage to the comparator C, predetermined voltage reference Vref, that is relatively precisely set.

In particular, the existing voltage reference circuit 1 includes a bandgap reference circuit 8 that generates reference signal PFIref. The unity gain differential amplifier 2 receives reference signal PFIref at a first input and generates an output signal n3 that is provided to the input of voltage divider circuit 3. Voltage divider circuit 3 includes a series connected string of resistors R. Connected in parallel with resistors R is one or more fuse elements 4. The fuse elements 4 are selectively blown so as to relatively precisely trim the voltage across the resistor string. The output Vref of voltage divider circuit 3, which is provided to the comparator C of FIG. 1, is taken from a voltage appearing along the string of series connected resistors R.

The existing voltage reference circuit 1 of FIG. 2 allows for trimming the output signal PFIref of the bandgap reference circuit 8 in either the positive or negative direction. Specifically, the existing voltage reference circuit 1 of FIG. 2 includes programmable circuitry 5 that generates control signals nt and nc, first multiplexing circuitry 6 and second multiplexing circuitry 7. First multiplexing circuitry 6 selects as feedback to a second input of unity gain differential amplifier 2 one of two voltage signals tapped from the series connected string of resistors R. The selection of the feedback signal is based upon the value of signals nt and nc. Similarly, second multiplexing circuitry 7 selects as the signal provided to comparator C one of the two voltage signals tapped from the string of resistors R. The selected signal is also based upon signals nt and nc. The control of first and second multiplexing circuits 6 and 7 by signals nt and nc is such that the bottom of the resistor string is provided as the feedback signal for differential amplifier 2 and the top of the resistor string is coupled to the reference signal Vref when a positive trim offset voltage is to be added to reference signal PFIref. Alternatively, the top of the resistor string is provided as the feedback signal for differential amplifier 2 and the bottom of the resistor string is coupled to the reference signal Vref when a negative trim offset voltage is to be added to reference signal PFIref.

One problem with existing power supply monitor circuits, such as the existing power supply monitor circuitry of FIGS. 1 and 2, is in monitoring a relatively slowly changing unregulated power supply. For instance, a slowly changing unregulated voltage at or near the predetermined reference voltage Vref may cause comparator C to oscillate. As can be seen, oscillation of comparator C may cause the corresponding processor/controller device to attempt repeated remedial measures and/or otherwise disrupt the operation of the system. Based upon the foregoing, there is a need for a power supply monitor circuit that precisely monitors a power supply without the potential to oscillate.

SUMMARY OF THE INVENTION

Embodiments of the present invention overcome shortcomings in existing power supply monitor circuits and satisfy a significant need for a substantially oscillation-free monitor circuit. Embodiments of the present invention utilize hysteresis so as to avoid oscillation due to a slowly changing unregulated supply voltage. In particular, hysteresis circuitry is incorporated into the above-described power supply monitor circuitry. The hysteresis circuitry varies the amount of the trim offset voltage applied to the output of the bandgap reference voltage signal PFIref based upon the state of the power fail signal PFO generated by a comparator.

In an embodiment of the present invention, the total resistance of the resistor string (and hence the amount of the trim offset voltage) is varied based upon power fail signal PFO. In other embodiments of the present invention, the reference signal Vref of the voltage follower circuit is tapped from any one of a plurality of locations along the resistor string based upon the state of the power fail signal PFO, thereby selectively adjusting the trim offset voltage.

The operation of the power supply monitor circuit includes selectively blowing fuses in the resistor string to achieve the desired voltage drop across the resistor string. Next, a determination is made as to whether a positive or negative trim offset voltage is to be applied to the output PFIref of the bandgap reference circuit. Thereafter, the reference signal Vref of the voltage follower is a trimmed offset voltage, with the amount of trim offset voltage being a first offset voltage when the unregulated supply voltage is greater than reference signal Vref and a second offset voltage when the unregulated supply voltage is less than the reference signal Vref.

BRIEF DESCRIPTION OF THE DRAWINGS

A more complete understanding of the system and method of the present invention may be obtained by reference to the following Detailed Description when taken in conjunction with the accompanying Drawings wherein:

FIG. 1 is a top level circuit diagram of an existing power supply monitor circuit;

FIG. 3 is a power supply monitor circuit according to embodiments of the present invention;

FIG. 5 is a circuit diagram of an alternate circuit of a portion of the voltage divider circuit of FIG. 4;

FIG. 6 is a voltage waveform describing the relationship between signals from the power supply monitor circuit of FIG. 3;

DETAILED DESCRIPTION OF THE PREFERRED EXEMPLARY EMBODIMENTS

Figure 2:
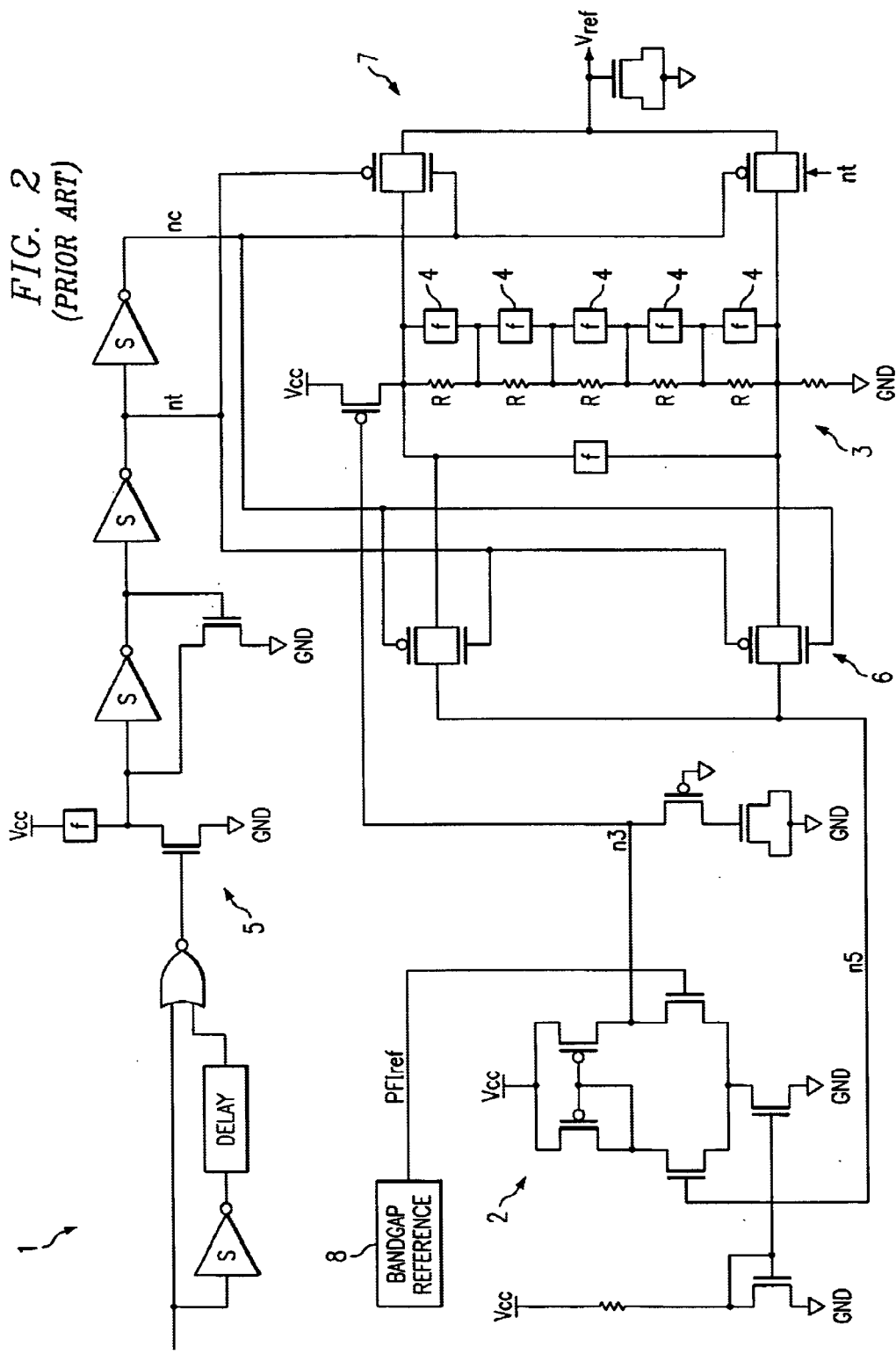
FIG. 2 is a circuit diagram of an existing voltage follower circuit from the circuit of FIG. 1.

The present invention will now be described more fully hereinafter with reference to the accompanying drawings in which a preferred embodiment of the invention is shown. This invention may, however, be embodied in many different forms and should not be construed as being limited to the embodiment set forth herein. Rather, the embodiment is provided so that this disclosure will be thorough and complete, and will fully convey the scope of the invention to those skilled in the art.

Referring to FIG. 3, there is disclosed a power supply monitor circuit 30 according to embodiments of the present invention. Power supply monitor circuit 30 receives an unregulated power failure input (PFI) signal and asserts a power failure output (PFO) signal when the PFI signal falls beneath a predetermined voltage level, reference signal Vref. A voltage reference circuit 31 generates reference signal Vref. A comparator 32 compares the voltage level of PFI signal to reference signal Vref. The output of comparator 32 indicates whether the voltage level of signal PFI is greater or less than reference signal Vref.

In general terms, voltage reference circuit 31 varies the amount of the trim offset voltage applied to bandgap reference voltage PFIref based upon the state of the signal PFO generated by comparator 32.

Voltage reference circuit 31 includes a bandgap reference circuit 36 that generates bandgap output signal PFIref. A differential amplifier 33 receives signal PFIref at a first input and generates an output signal n3 that is input to a voltage divider circuit 34. Differential amplifier 33 may be implemented as differential amplifier 2 of FIG. 3, but it is understood that differential amplifier 33 may be implemented in other ways and may use devices other than MOS transistors.

Voltage divider circuit 34 generates a first output signal n5 that is fed back to a second input of differential amplifier 33 so as to form a substantially unity gain amplifier or voltage follower circuit therewith. Voltage divider circuit 34 further generates reference signal Vref. Voltage reference circuit 31 may further include a programmable/programmed circuit 35, having substantially the same circuitry as the programmable/programmed circuit 5 discussed above with respect to FIG. 2.

The voltage follower circuit formed by differential amplifier 33 and voltage divider circuit 34 additionally applies to bandgap reference output signal PFIref a trimmed offset voltage so that the reference signal Vref is an offset voltage from bandgap reference output signal PFIref. Reference signal Vref is applied to an input of comparator 32 of FIG. 3.

Figure 4:
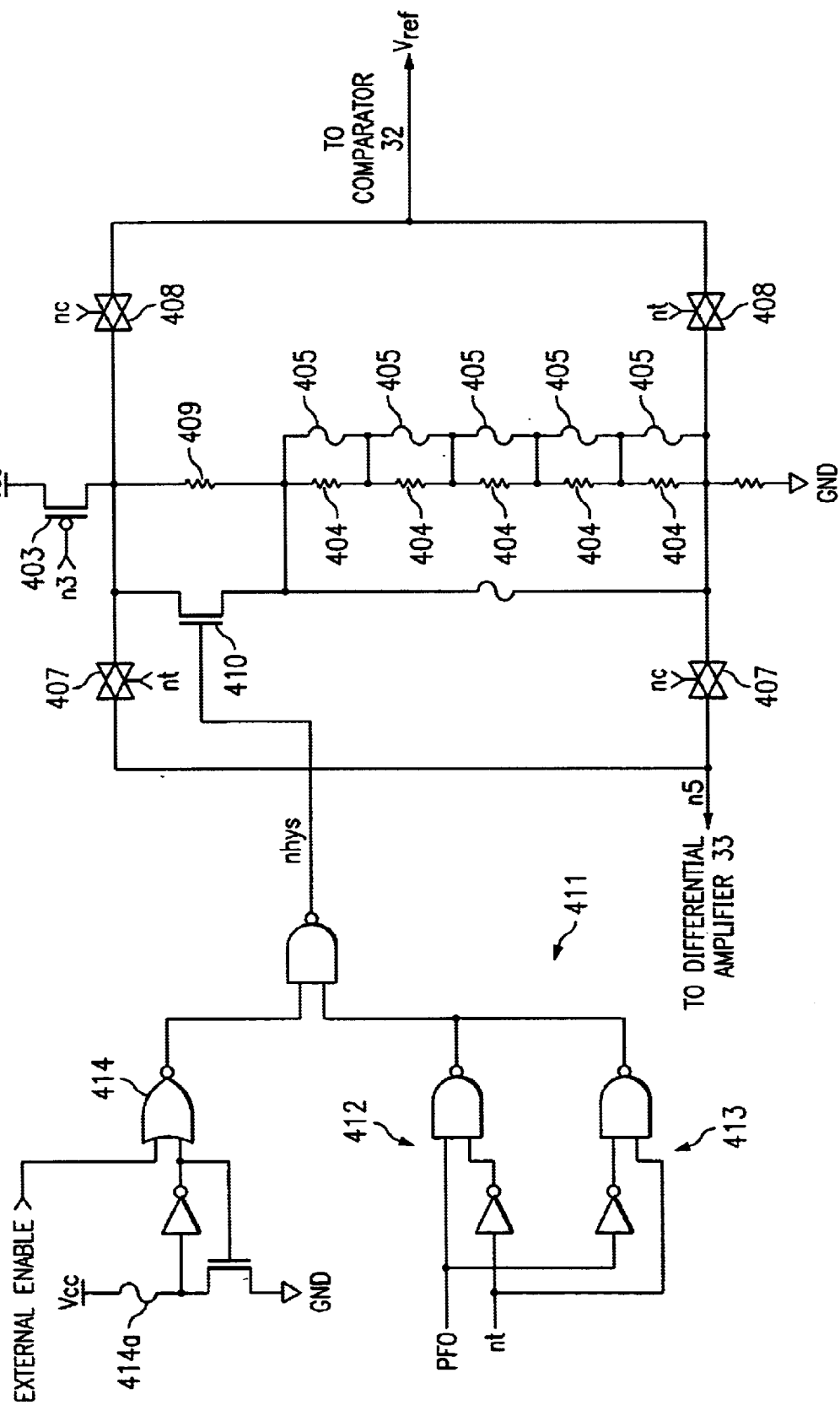
FIG. 4 is a circuit diagram of a voltage divider circuit of the power supply monitor circuit of FIG. 3, according to a first embodiment of the present invention.

According to a first embodiment of the present invention shown in FIG. 4, voltage divider circuit 34 includes a transistor 403 having a gate terminal connected to the output signal n3 of differential amplifier 33. Coupled to a drain/source terminal of transistor 403 is a string of series-connected resistors 404. The string of resistors 404 is trimmable by voltage divider circuit 34 including one or more fuse elements 405, with each fuse element 405 being parallel-connected to a distinct resistor 404. Fuse elements 405 provide adjustability of the resistance value of the string of resistors 404 and hence control the trim offset voltage applied to bandgap reference circuit PFIref.

Similar to the existing voltage reference circuit of FIG. 2, voltage reference circuit 31 provides for trimming of the bandgap reference circuit output signal PFIref in either the positive or negative direction. In other words, voltage reference circuit 31 allows for the selection of the polarity of the trim offset voltage to be applied to signal PFIref.

In particular, voltage reference circuit 31 may include programmable circuitry 35 (FIG. 3) that generates control signals nt and nc, first multiplexing circuitry 407 and second multiplexing circuitry 408 (FIG. 4). First multiplexing circuitry 407 selects as feedback to a second input of differential amplifier 33 one of two voltage signals tapped from the string of resistors 404. The selection of the feedback signal is based upon the value of signals nt and nc. Similarly, second multiplexing circuitry 408 selects as the signal provided to reference signal Vref one of the two voltage signals tapped from the string of resistors 404 based upon signals nt and nc. The control of first and second multiplexing circuits 407 and 408 by signals nt and nc is such that the bottom of the resistor string is provided as the feedback signal for differential amplifier 33 and the top of the resistor string is provided to the reference signal Vref when a positive trim offset voltage is to be added to reference signal PFIref. Alternatively, the top of the resistor string is provided as the feedback signal for differential amplifier 33 and the bottom of the resistor string is provided to the reference signal Vref when a negative trim offset voltage is to be added to reference signal PFIref. Once programmable circuit 35 is programmed, signals nt and nc are permanently fixed to their desired logic levels. Programmable circuitry 35 may include one or more blowable fuse elements (FIG. 2) for programming the polarity of the trim offset voltage.

In order to eliminate oscillation due to a relatively slowly varying unregulated supply voltage, embodiments of the present invention include hysteresis. Specifically, voltage follower circuit includes hysteresis circuitry for modifying the offset voltage applied to bandgap reference output signal PFIref based upon the state of the output of comparator 32. With reference to FIG. 4, the hysteresis circuitry includes a resistor 409 connected in series with the string of resistors 404, and an enabling transistor 410 connected in parallel with resistor 409. The hysteresis circuitry may further include control logic 411 which selectively switches enabling transistor 410 between on and off states. By switching enabling transistor 410 between on and off states, the value of the trim offset voltage applied to signal PFIref varies by an amount substantially equal to the product of the resistance of resistor 409 and the current flowing through voltage divider circuit 34.

To provide the hysteresis effect, control logic 411 receives as an input the signal PFO generated by comparator 32. In particular, control logic 411 may include a non-inverting logic path 412 between signal PFO and the gate/control terminal of enabling transistor 410 that is enabled when a positive offset voltage is to be added to signal PFIref; and an inverting logic path 413 between signal PFO and the gate/control terminal of transistor 410 that is enabled when a negative offset voltage is to be added to signal PFIref. Inverting logic path 413 and non-inverting logic path 412 may include NAND logic gates and inverters, but it is understood that the logic paths 412 and 413 may be implemented with other circuitry.

Control logic 411 may further include enabling circuitry 414 for selectively disabling the hysteresis effect, including a blowable fuse element 414a and/or an external input for receiving a signal that is externally tied to a logical high/low reference voltage level.

Instead of utilizing a single transistor 410, it is understood that the hysteresis circuitry may include other resistive circuitry for varying the trim offset voltage and/or voltage level of signal Vref. For instance, hysteresis circuitry may include a number of series connected resistors that are individually enabled. FIG. 5 shows an alternative implementation to the parallel combination of resistor 409 and enabling transistor 410 which may allow for finer adjustment of the trim offset voltage, including series connected resistive elements 51 connected in parallel with an enabling transistor 410. A blowable fuse element 52 may be connected in parallel with a resistive element 51, and a second enabling transistor 53 may be connected in parallel with another resistive element 51 and driven by fuse circuitry 54.

The operation of the power supply monitor circuit 30 (FIG. 3) including voltage divider circuit 34 (FIG. 4) will be described. Initially, it is determined whether a positive or negative offset voltage will be applied to the signal PFIref generated by the bandgap reference circuit 36, and the fuse elements in programmable circuitry 35 are selectively blown based upon the determination. This causes first multiplexing circuit 407 to couple the second input of differential amplifier 33 to one of the top and the bottom of the string of resistors 404, and second multiplexing circuit 408 to couple signal Vref to the other of the top and the bottom of the resistor string. Further, fuse elements 405 are selectively blown so as to provide the desired trim offset voltage to be applied to signal PFIref. Fuse elements in enabling circuitry 414 are also selectively blown so as to enable the hysteresis effect.

When the output of comparator 32 indicates that the unregulated voltage signal PFI is greater than reference signal Vref (so that output signal PFO is at a logic one level) and a positive offset voltage has been programmed/selected, non-inverting logic path 412 is turned on which activates enabling transistor 410 so as to short the voltage across hysteresis resistor 409. This results in the voltage appearing on signal Vref (the voltage appearing at the top of the resistors as selected by second multiplexer circuit 408) to be lowered, such as by 10 mv. When the output of comparator 32 indicates that the unregulated voltage level PFI is less than reference signal Vref (so that output signal PFO is at a logic zero level) and still assuming the case of the positive offset voltage being programmed, inverting logic path 413 is activated which turns off enabling transistor 410 so as to provide a non-zero voltage across hysteresis resistor 409. This results in the voltage appearing on reference signal Vref to be raised, such as by 10 mv. This variation of the voltage across the resistor 409 based upon the output of comparator 32 thereby provides the necessary voltage change for signal Vref so as to provide a hysteresis effect.

In the event that a negative offset voltage has been programmed/selected, when the output of comparator 32 indicates that the unregulated voltage signal PFI is greater than reference signal Vref (i.e., output signal PFO being at a logic one level), inverting logic path 413 is turned on which activates enabling transistor 410 so as to create a non-zero voltage across hysteresis resistor 409. This results in the voltage appearing on signal Vref (the voltage appearing at the bottom of the resistors 404 as selected by second multiplexer circuit 408) to be lowered, such as by 10 mv. When the output of comparator 32 indicates that the unregulated voltage level PFI is less than signal Vref (i.e., output signal PFO being at a logic zero level) and still assuming the case of the negative offset voltage being programmed, non-inverting logic path 412 is activated which shorts hysteresis resistor 409. This results in the voltage appearing on signal to be raised, such as by 10 mv. This variation of the voltage across the resistor 409 based upon the output of comparator 32 thereby provides the necessary voltage change for signal Vref so as to provide a hysteresis effect.

Figure 7:
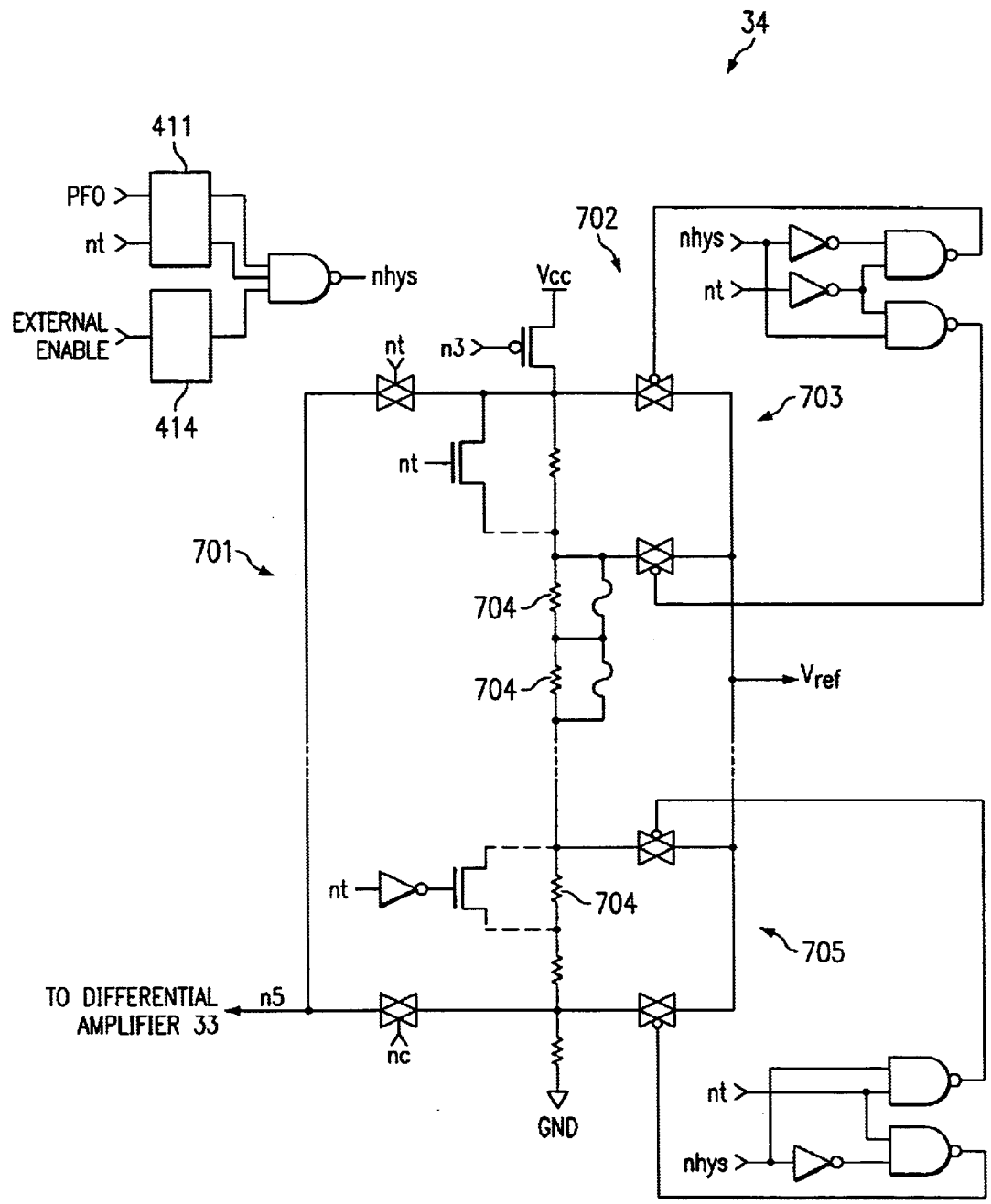
FIG. 7 is a circuit diagram of a voltage divider circuit according to a second embodiment of the present invention.

A second embodiment of the voltage divider circuit 34 is shown in FIG. 7. In this case, instead of selectively shorting a resistor series connected with the string of resistors 404, this voltage divider circuit 34 of FIG. 7 selectively switches the location along the string of resistors 404 to be coupled to reference signal Vref between two tap points based upon the output signal PFO of comparator 32. As shown in FIG. 7, the hysteresis circuitry is incorporated into the control circuitry for the second multiplexing circuit that selects the tap point for coupling to reference signal Vref.

In particular, the second multiplexing circuit 702 is configured as a pair of 2:1 multiplexer circuits, only one of which is enabled based upon whether a positive or negative trim offset voltage is programmed. One 2:1 multiplexer circuit 703 is enabled when a positive trim offset voltage is programmed so as to pass one of two tap points along the top of a string of resistors 704 based upon the output signal PFO. The 2:1 multiplexer circuit 703 passes a tap point to reference signal Vref that is higher (lower) along the string of resistors 704 when the unregulated voltage is less (greater) than reference signal Vref. A second 2:1 multiplexer circuit 705 is enabled when a positive trim offset voltage is programmed so as to pass one of two tap points along the top of resistor string 704 based upon the output signal PFO. The 2:1 multiplexer circuit 705 passes a tap point to reference signal Vref that is higher (lower) along the string of resistors 704 when the unregulated voltage is less (greater) than signal Vref. The signal nhys (generated by control logic 411 and enabling logic 414 from FIG. 4) is ANDed with signal nt and used as the selection signal for the two 2:1 multiplexer circuits. As can be seen, non-inverting logic path 412 and inverting logic path 413 are used to control multiplexer circuits 703 and 705. In particular, signal nt, which determines the polarity of the trim offset voltage, selectively disables signal nhys as it is applied to multiplexer circuits 703, 705. The voltage follower circuit including voltage divider circuit 34 of FIG. 7 has been shown to provide a better AC response relative to voltage follower circuit having voltage divider circuit 34 of FIG. 4. In the voltage divider circuit 34 of FIG. 7, the resistor coupled to the disabled 2:1 multiplexer circuit may be selectively shorted, as shown in dashed lines in FIG. 7.

Figure 8:
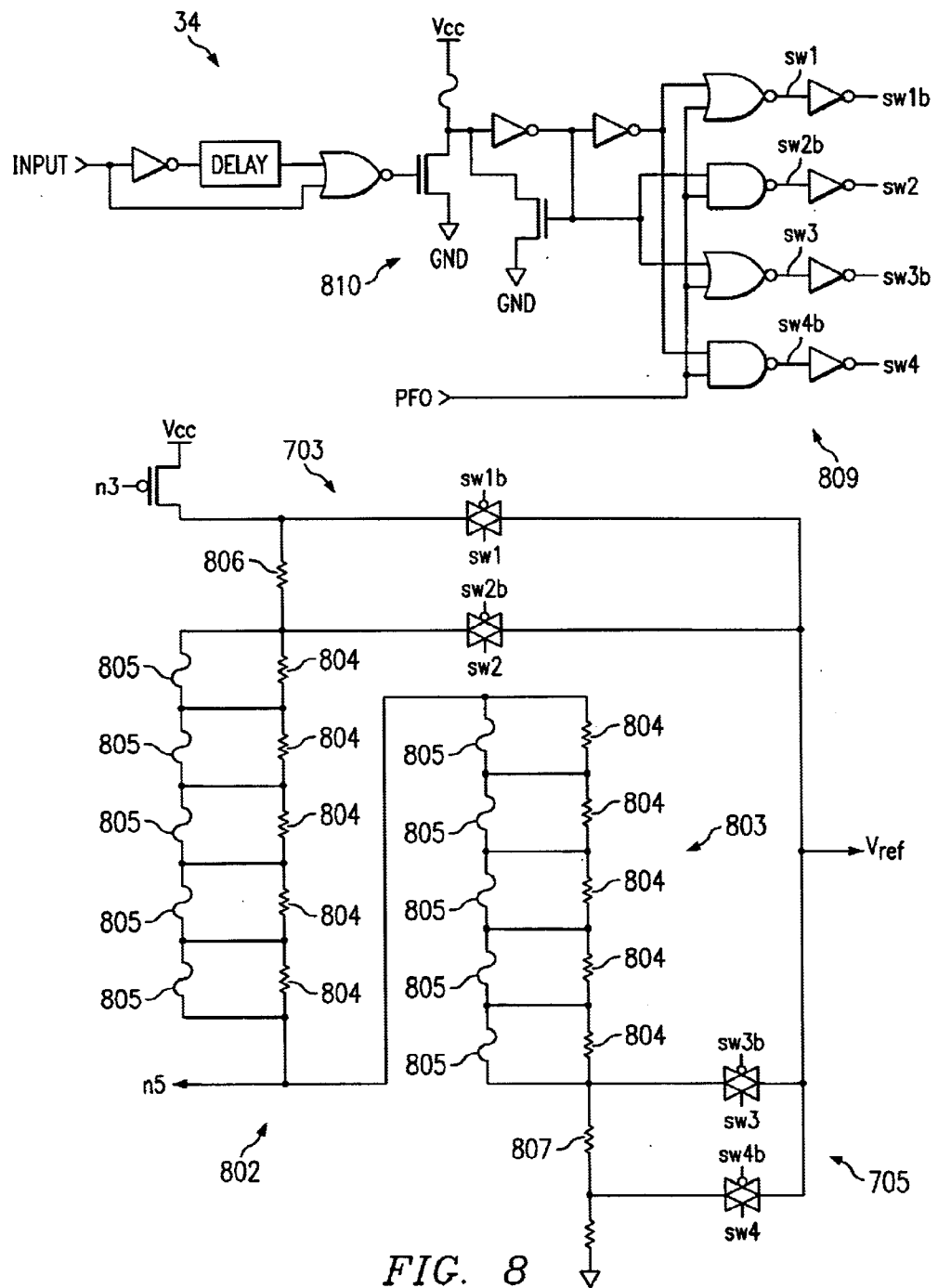
FIG. 8 is a circuit diagram of a voltage divider circuit according to a third embodiment of the present invention.

A third embodiment of the present invention is shown in FIG. 8. In this case, voltage divider circuit 34 includes the pair of 2:1 multiplexer circuits 703, 705 as shown in FIG. 7. However, the feedback signal n5 that is fed back to the second input of the differential amplifier 33 is not selected by a multiplexing circuit as utilized in the above-described embodiments. Instead, a pair of series-connected resistor strings 802 and 803 are connected between feedback signal n3 (generated by differential amplifier 33) and the ground potential, with the node between resistor strings 802, 803 being feedback signal n3. Each resistor 804 in resistor strings 802, 803 is connected in parallel with a fuse element 805. Each of hysteresis resistors 806 and 807 are connected in series with resistor strings 802 and 803, with hysteresis resistor 806 being at the top of resistor string 802 and hysteresis resistor 807 being at the bottom of resistor string 803.

The third embodiment of the present invention further includes control logic 809 for enabling (disabling) multiplexer circuit 703 (705) when a positive trim offset voltage is desired, and enabling (disabling) multiplexer circuit 705 (703) when a negative trim offset voltage is desired. Control logic 809 receives signal PFO for controlling the enabled multiplexer circuit so as to switch between the two nodes on either side of the hysteresis resistor associated with the enabled multiplexer circuit. As can be seen, control logic 809 receives as inputs and decodes power fail output signal PFO (generated by comparator 32) and a signal(s) generated by a fuse circuit 810. In this way, voltage divider circuit 34 of FIG. 8 varies the voltage connected to reference signal Vref based upon power fail output signal PFO so as to provide a hysteresis effect.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A supply voltage level detection circuit, comprising:
    a voltage reference circuit for generating a first reference voltage signal;
    a voltage follower circuit, coupled to the voltage reference circuit, for receiving the first reference voltage signal and generating a second reference voltage signal based upon the first reference voltage signal; and
    a compare circuit, coupled to the voltage follower circuit, for comparing a signal representative of a supply voltage level to the second reference voltage signal, and generating an alarm signal having a value based upon the comparison, a voltage difference between the first and second reference voltage signals being based upon the state of the alarm signal;
    wherein the voltage follower circuit comprises:
        a string of series-connected resistive elements;
        at least one multiplexing circuit having inputs connected to at least two locations along the string of resistive elements and an output coupled to the second reference voltage signal; and
        control logic having an input coupled to the alarm signal and an output coupled to a control input of the multiplexer circuit.

2. The supply voltage level detection circuit of claim 1, wherein:
    the second reference voltage signal is at first voltage level when the alarm signal indicates that the signal representative of the supply voltage level is greater than the second reference voltage signal, and a second voltage level when the alarm signal indicates that the signal representative of the supply voltage level is less than the second reference voltage signal, the first voltage level being less than the second voltage level.

3. The supply voltage level detection circuit of claim 1, wherein the voltage follower circuit further comprises:
    a differential amplifier having a first input coupled to the first reference voltage signal, an output coupled to a first node of the string of series-connected resistive elements, and a second input of the differential amplifier coupled to a second node in the string of series-connected resistive elements.

4. The supply voltage level detection circuit of claim 1, wherein the voltage follower circuit further comprises:
    a plurality of multiplexing circuits, each multiplexing circuit having inputs connected to distinct locations along the string of resistive elements and an output coupled to the second reference voltage signal, wherein the control logic selectively enables only one of the multiplexing circuits.

5. The supply voltage level detection circuit of claim 4, wherein:
    a first of the plurality of multiplexing circuits receives as inputs signals between resistive elements of the string of resistors near the top thereof; and
    a second of the plurality of multiplexing circuits receives as inputs signals between resistive elements of the string of resistors near the bottom thereof.

6. The supply voltage level detection circuit of claim 4, wherein the control logic includes programmable/programmed circuit elements.

7. The supply voltage level detection circuit of claim 1, wherein:
    the at least one multiplexing circuit comprises a plurality of multiplexing circuits, each multiplexing circut having inputs connected to a plurality of distinct nodes along the string of resistive elements and an output coupled to the second reference voltage signal.

8. The supply voltage level detection circuit of claim 7, wherein each of the plurality of multiplexing circuits includes a first control input coupled to the alarm signal and a second control input coupled to a configuration signal identifying whether the second reference voltage signal is to be greater than or less than the first reference voltage signal.

9. A supply voltage level detection circuit, comprising:
    a voltage reference circuit for generating a first reference voltage signal;
    a voltage follower circuit, coupled to the voltage reference circuit, for receiving the first reference voltage signal and generating a second reference voltage signal based upon the first reference voltage signal; and
    a compare circuit, coupled to the voltage follower circuit, for comparing a signal representative of a supply voltage level to the second reference voltage signal, and generating an alarm signal having a value based upon the comparison, a voltage difference between the first and second reference voltage signals being based upon the state of the alarm signal;
    the voltage follower circuit comprises:
        a string of series-connected resistive elements;
        a first transistor connected in parallel with at least one resistive element; and
        control logic having an output coupled to a control terminal of the transistor and an input coupled to the alarm signal;
    the voltage follower circuit is configured so as to set the second reference voltage signal to any of one or more voltage levels greater than the first reference voltage signal and one or more voltage levels less than the first reference voltage signal;

the control logic output is based upon the configuration of the voltage follower circuit.

10. The supply voltage level detection circuit of claim 9, wherein:
the first transistor is connected in parallel with a plurality of series-connected resistive elements, at least one of the series-connected resistive elements to which the first transistor is connected in parallel with is programmably shorted.

11. The supply voltage level detection circuit of claim 9, wherein the control logic is selectively disabled so as to maintain the first transistor in one of an on state and an off state.

12. The supply voltage level detection circuit of claim 9, wherein the voltage follower includes at least one multiplexer circuit coupled to the string of series-connected resistive elements having an output coupled to an output that generates the second reference voltage signal and a first control input coupled to the alarm signal.

13. The supply voltage level detection circuit of claim 12, wherein the at least one multiplexer circuit includes a second input coupled to a configuration signal identifying whether the second reference voltage signal is to be greater than or less than the first reference voltage signal.

14. A method of monitoring the voltage level of a supply voltage, comprising:
generating a first reference voltage signal;
receiving the first reference voltage signal and generating a second reference voltage signal based upon the first reference voltage signal, the second reference voltage signal being a trimmed signal; and
comparing a supply signal representative of a supply voltage level to the second reference voltage signal, and generating an alarm signal having a value based upon the comparison, the second reference voltage signal being based upon the comparison and being selectively programmed to be less than the first reference voltage signal.

15. The method of claim 14, wherein the voltage difference between the first reference voltage signal and the second reference voltage signal is based upon the comparison.

16. The method of claim 15, wherein:
the voltage difference is a first voltage amount when the supply signal is greater than the second reference voltage signal and a second voltage amount when the supply signal is less than the second reference voltage signal, the first voltage amount being greater than the second voltage amount.

17. The method of claim 15, wherein:
the voltage difference is a first voltage amount when the supply signal is greater than the second reference voltage signal and a second voltage amount when the supply signal is less than the second reference voltage signal, the first voltage amount being less than the second voltage amount.

18. The method of claim 15, wherein:
a portion of the voltage difference is programmably set.

19. The method of claim 14, wherein:
the second reference voltage signal is at a first voltage level when the supply signal is greater than the second reference voltage signal and a second voltage level when the supply signal is less than the second reference voltage signal, the first voltage level being less than the second voltage level.

20. The method of claim 14, wherein the step of generating the second reference voltage signal comprises selecting, based upon the alarm signal, from a plurality of voltage levels for the second reference voltage signal.

21. An integrated circuit, comprising:
a first circuit for receiving a reference signal representative of a reference voltage and generating a trimmed reference signal based upon the reference signal; and
a comparator circuit, coupled to the first circuit, for comparing the trimmed reference signal to an unregulated supply signal and generating an output signal based upon the comparison;
the first circuit including hysteresis circuitry for varying the voltage of the trimmed reference signal based upon the output signal;
the first circuit comprises a voltage follower including a string of components, a voltage drop appearing across each component;
the hysteresis circuitry includes control circuitry for receiving the output signal and selectively shorting the voltage across at least one component in the string based upon the output signal;
the control circuitry comprises control logic having an input coupled to the output signal and a transistor connected in parallel across the at least one component and having a control terminal driven by the control logic;
the first circuit includes selection circuitry for selecting a polarity of the voltage difference between the reference signal and the trimmed reference signal and for selecting a node in the string of components for the trimmed reference signal based upon the output signal.

22. The integrated circuit of claim 21, wherien the hysteresis circuitry includes control circuitry for receiving the output signal and selectively shorting the voltage across at least one component in the string based upon the output signal.

23. The integrated circuit of claim 22, wherein the control circuitry comprises control logic having an input coupled to the output signal and a transistor connected in parallel across the at least one component and having a control terminal driven by the control logic.

24. The integrated circuit of claim 23, wherein the control circuitry includes first and second logic paths coupled between the output signal and the control terminal of the transistor, the first and second logic paths being selected based upon the selection circuitry.

25. An integrated circuit, comprising:
a first circuit for receiving a reference signal representative of a reference voltage and generating a trimmed reference signal based upon the reference signal; and
a comparator circuit, coupled to the first circuit, for comparing the trimmed reference signal to an unregulated supply signal and generating an output signal based upon the comparison;
the first circuit including hysteresis circuitry for varying the voltage of the trimmed reference signal based upon the output signal;
the first circuit comprises a voltage follower including a string of components, a voltage drop appearing across each component;
the hysteresis circuitry includes control circuitry for selectively coupling to the trimmed reference signal any of a plurality of tap points along the string of components based upon the state of the output signal;
wherein the control circuitry comprises a first multiplexer circuit having as inputs at least two locations along the string of components, and control logic having an input coupled to the output signal and an output driving a selection input of the first multiplexer circuit.

26. The integrated circuit of claim 25, wherein:
the first circuit includes selection circuitry for selecting a polarity of the voltage difference between the reference signal and the trimmed reference signal; and
the control logic includes first and second logic paths between the output signal and the selection input of the first multiplexer circuit, the first and second logic paths being selected based upon the selection circuitry.

27. The integrated circuit of claim 26, wherein the control circuitry further comprises:
a second multiplexer circuit having as inputs at least two locations along the string of components, distinct from the two locations associated with the first multiplexer circuit, the control logic driving a selection input of the second multiplexer circuit, one of the first and second multiplexer circuits being enabled by the selection circuitry.

28. A supply voltage level detection circuit, comprising:
a voltage follower circuit for receiving a first reference voltage signal and generating a second reference voltage signal based upon the first reference voltage signal; and
a compare circuit, coupled to the voltage follower circuit, for comparing a signal representative of a supply voltage level to the second reference voltage signal, and generating an alarm signal having a value based upon the comparison, the second reference voltage signal being based upon the comparison and being selectively programmed to be greater than and selectively programmed to be less than the first reference voltage signal;
wherein the voltage follower circuit comprises:
a string of series-connected resistive elements;
at least one multiplexing circuit having inputs connected to at least two locations along the string of resistive elements and an output coupled to the second reference voltage signal; and
control logic having an input coupled to the alarm signal and an output coupled to a control input of the multiplexer circuit.

29. The supply voltage level detection circuit of claim 28, wherein:

the second reference voltage signal is at first voltage level when the alarm signal indicates that the signal representative of the supply voltage level is greater than the second reference voltage signal, and a second voltage level when the alarm signal indicates that the signal representative of the supply voltage level is less than the second reference voltage signal, the first voltage level being less than the second voltage level.

30. The supply voltage level detection circuit of claim 28, wherein the voltage follower circuit comprises:
an amplifier circuit;
a string of series-connected resistive elements coupled in a feed back path of the amplifier circuit;
a first transistor connected in parallel with at least one resistive element; and
control logic having an output coupled to a control terminal of the transistor and an input coupled to the alarm signal.

31. An integrated circuit, comprising:
a first circuit for receiving a reference signal representative of a reference voltage and generating a trimmed reference signal based upon the supply signal; and
a comparator circuit, coupled to the first circuit, for comparing the trimmed reference signal to an unregulated supply signal and generating an output signal based upon the comparison;
the first circuit including hysteresis circuitry for varying the voltage of the trimmed reference signal based upon the output signal, the trimmed reference signal being greater than or less than the reference signal based upon the comparison.

32. The integrated circuit of claim 31, wherein:
the hysteresis circuitry includes control circuitry for receiving the output signal and selectively shorting the voltage across at least one resistive element in the string based upon the output signal.

33. The integrated circuit of claim 31, wherein:
the hysteresis circuitry includes control circuitry for selectively coupling to the trimmed reference signal any of a plurality of nodes in the string of resistive elements based upon the state of the output signal.

* * * * *

UNITED STATES PATENT AND TRADEMARK OFFICE
CERTIFICATE OF CORRECTION

PATENT NO. : 6,750,683 B2
APPLICATION NO. : 09/846524
DATED : June 15, 2004
INVENTOR(S) : McClure et al.

It is certified that error appears in the above-identified patent and that said Letters Patent is hereby corrected as shown below:

Column 7, lines 55-57, Claim 1
Replace "control input of the multiplexer circuit."
With --control input of the at least one multiplexing circuit.--

Column 8, line 61, Claim 9
Replace "of the transistor"
With --of the first transistor--

Column 8, lines 66-67, Claim 9
Replace "signal and one or more voltage levels less than the first reference voltage signal;"
With --signal and selectively configured so as to set the second reference voltage signal to any of one or more voltage levels less than the first reference voltage signal;--

Column 9, lines 36-37, Claim 14
Replace "selectively programmed to be less than the first reference voltage signal."
With --selectively programmed to be greater than and selectively programmed to be less than the first reference voltage signal.--

Column 10, lines 15-17, Claim 21
Replace "the first circuit comprises a voltage follower including a string components, a voltage drop appearing across each component;"
With --the first circuit comprises a voltage follower including the hysteresis circuitry, a differential amplifier and a string of components coupled in a feedback path of the differential amplifier, a voltage drop appearing across each component;--

UNITED STATES PATENT AND TRADEMARK OFFICE
CERTIFICATE OF CORRECTION

| | | |
|---|---|---|
| PATENT NO. | : 6,750,683 | |
| APPLICATION NO. | : 09/846524 | |
| DATED | : June 15, 2004 | |
| INVENTOR(S) | : David C. McClure et al. | |

It is certified that error appears in the above-identified patent and that said Letters Patent is hereby corrected as shown below:

| | |
|---|---|
| Column 10, lines 27-29, Claim 21 | Replace "the first circuit includes selection circuitry for selecting a polarity of the voltage difference between the reference signal and the trimmed reference signal" With --the first circuit further includes selection circuitry coupled to a plurality of nodes in the string of components for selecting a polarity of the voltage difference between the reference signal and the trimmed reference signal-- |
| Column 10, lines 55-57, Claim 25 | Delete "the first circuit including hysteresis circuitry for varying the voltage of the trimmed reference signal based upon the output signal;" |
| Column 10, lines 58-60, Claim 25 | Replace "the first circuit comprises a voltage follower including a string of components, a voltage drop appearing across each component;" With --the first circuit comprises a voltage follower including a string of components, a voltage drop appearing across each component, and hysteresis circuitry for varying the voltage of the trimmed reference signal based upon the output signal;-- |
| Column 12, lines 26-29, Claim 31 | Replace "a comparator circuit, coupled to the first circuit, for comparing the trimmed reference signal to an unregulated supply signal and generating an output signal based upon the comparison;" With --a comparator circuit, coupled to the first circuit, for comparing the trimmed reference signal to a second reference signal and generating an output signal based upon the comparison;-- |

UNITED STATES PATENT AND TRADEMARK OFFICE
CERTIFICATE OF CORRECTION

PATENT NO.       : 6,750,683 B2                           Page 3 of 3
APPLICATION NO.  : 09/846524
DATED            : June 15, 2004
INVENTOR(S)      : David C. McClure et al.

It is certified that error appears in the above-identified patent and that said Letters Patent is hereby corrected as shown below:

Column 12, lines 30-34, Claim 31

Replace "the first circuit including hysteresis circuitry for varying the voltage of the trimmed reference signal based upon the output signal, the trimmed reference signal being greater than or less than the reference signal based upon the comparison."
With --the first circuit including a differential amplifier and a string of resistive elements coupled thereto, and hysteresis circuitry coupled to the string of resistive elements for receiving the output signal and for varying the voltage of the trimmed reference signal based upon the output signal, comprising circuitry for selecting from a plurality of nodes in the string of resistive elements for use in setting the voltage level of the trimmed reference signal, based upon the comparison. --

Signed and Sealed this

Fifteenth Day of August, 2006

JON W. DUDAS
*Director of the United States Patent and Trademark Office*